(12) United States Patent
Cross

(10) Patent No.: US 7,973,488 B2
(45) Date of Patent: *Jul. 5, 2011

(54) CONSTANT CURRENT DRIVER CIRCUIT WITH VOLTAGE COMPENSATED CURRENT SENSE MIRROR

(75) Inventor: John Cross, Needham, MA (US)

(73) Assignee: Osram Sylvania Inc., Danvers, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/857,598

(22) Filed: Aug. 17, 2010

(65) Prior Publication Data

US 2010/0308750 A1 Dec. 9, 2010

Related U.S. Application Data

(63) Continuation of application No. 11/862,570, filed on Sep. 27, 2007, now Pat. No. 7,781,985.

(51) Int. Cl.
*H05B 37/02* (2006.01)
*G05F 3/16* (2006.01)

(52) U.S. Cl. ........ 315/224; 315/307; 315/310; 323/225; 323/271; 323/282; 323/315

(58) Field of Classification Search .............. 315/209 R, 315/224, 225, 245, 264, 291, 307, 310; 323/225, 323/271, 272, 275, 282, 284, 297, 315, 317
See application file for complete search history.

(56) References Cited

U.S. PATENT DOCUMENTS

| | | | |
|---|---|---|---|
| 3,857,047 A * | 12/1974 | Knight | 327/53 |
| 6,188,211 B1 * | 2/2001 | Rincon-Mora et al. | 323/280 |
| 6,954,058 B2 * | 10/2005 | Ota et al. | 323/315 |
| 7,196,912 B2 * | 3/2007 | Ohta et al. | 363/21.03 |
| 7,781,985 B2 * | 8/2010 | Cross | 315/307 |

* cited by examiner

*Primary Examiner* — Jacob Y Choi
*Assistant Examiner* — Jimmy T Vu
(74) *Attorney, Agent, or Firm* — Shaun P. Montana

(57) ABSTRACT

A current sensing circuit for sensing the current provided to LEDs by a constant current power source includes a resistive shunt in series with the load and a current mirror having a first leg connected to a first terminal of the resistive shunt and a second leg connected to a second terminal of the resistive shunt. Both legs of the current mirror are also connected to ground. The first leg provides a reference signal to the second leg, and the second leg uses the reference signal and a voltage at the second terminal of the resistive shunt to provide a ground referenced output signal indicative of the current provided to the LEDs.

17 Claims, 4 Drawing Sheets

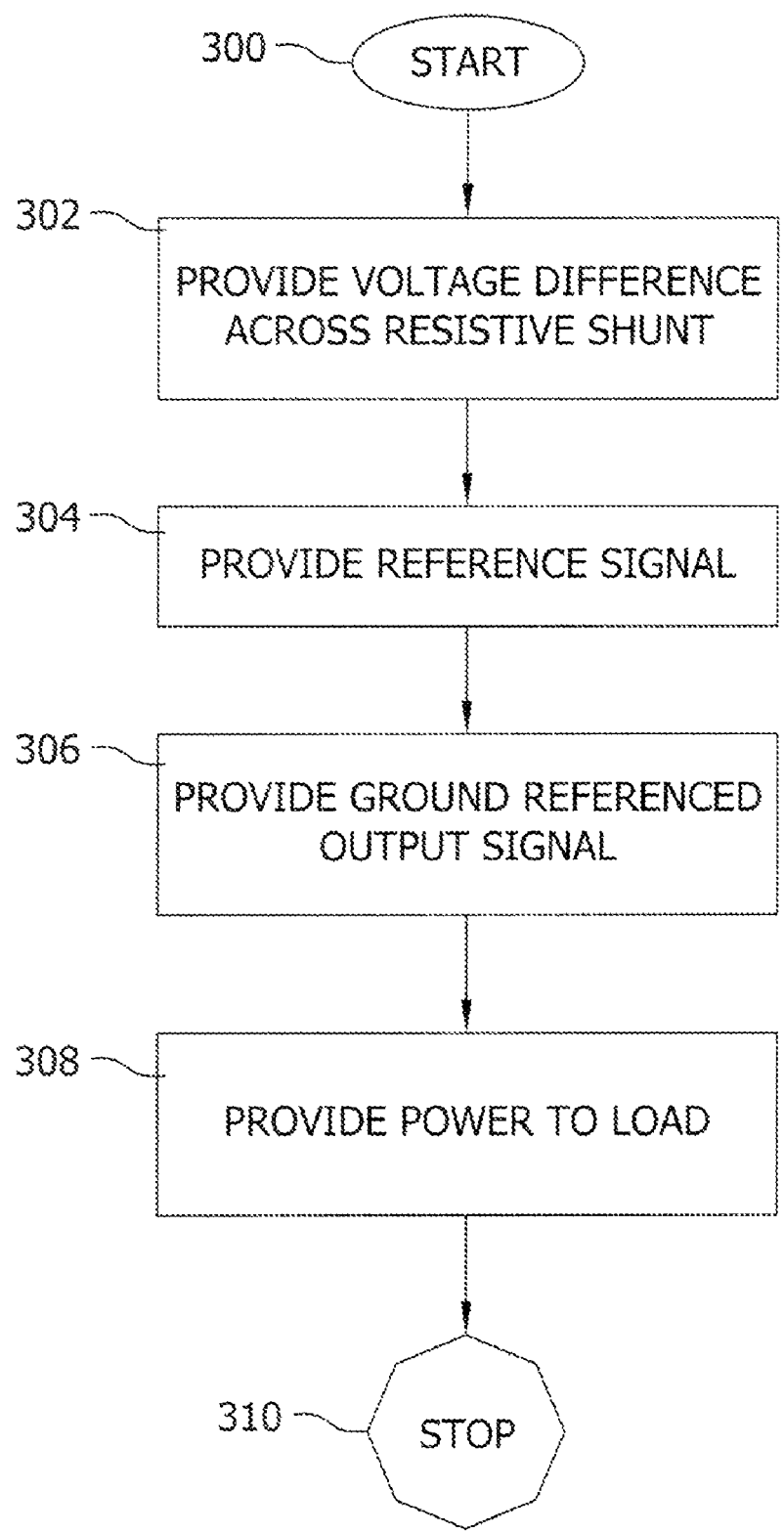

CONSTANT CURRENT DRIVER CIRCUIT WITH VOLTAGE COMPENSATED CURRENT SENSE MIRROR

CROSS-REFERENCE TO RELATED APPLICATION

The present application is a continuation of U.S. patent application Ser. No. 11/862,570, filed on Sep. 27, 2007, now U.S. Pat. No. 7,781,985, the entire contents of which are hereby incorporated by reference.

TECHNICAL FIELD

The present invention relates to electronic driver circuits, and more specifically, to electronic driver circuits that provide a constant current to a load.

BACKGROUND

A driver circuit for providing a regulated current (i.e., a constant current source) to a load must be able to determine the actual current provided to the load in order to accurately regulate the current. A ground referenced signal indicative of the actual current is required because most electronic circuits and devices operate based on ground referenced signals. In a driver circuit topology where the load can be adequately powered by an input voltage to the driver circuit (e.g. a voltage required at the load to maintain the regulated current is less than the input voltage), a resistor can be placed between ground and a negative terminal of the load such that a voltage at the negative terminal of the load provides the ground referenced signal indicative of the current through the resistor and the load.

For loads that require a voltage higher than the input voltage to the driver circuit to maintain the regulated current in the load, the driver circuit must include a direct current (DC) to DC converter. The DC to DC converter may be a fly back converter, a buck boost converter, a blocking boost converter, or any other type of converter for providing DC power. In this driver circuit topology, the load is connected between a positive and a negative terminal of the converter, not connected between the positive terminal of the converter and ground. Therefore, connecting a resistor between the load and ground does not provide a ground referenced signal indicative of the actual current provided to the load. Integrated circuit solutions are available for providing a ground referenced signal proportional to the actual current provided to the load, but these circuits are cost prohibitive in many applications. For example, a driver circuit for powering light emitting diode (LED) lighting in a vehicle cannot feasibly include this integrated circuit solution due to the additional cost.

SUMMARY

In one embodiment of the invention, a current sensing circuit includes a resistive shunt and a current mirror for producing a ground referenced output signal indicative of a current through the resistive shunt. The resistive shunt is connected in series with a load which is energized by a converter for providing the load with a constant current (i.e., a regulated current). Thus, the current provided to the load is also provided to the resistive shunt. The current mirror has a first leg and a second leg, each connected to the resistive shunt and a ground. The first leg of the current mirror is connected between a first terminal of the resistive shunt and the ground. The first leg includes a first device having a high side connected to the first terminal of the resistive shunt and a low side connected to a high side of a first resistor. A low side of the first resistor is connected to the ground. An input of the first device is connected to the low side of the first device, and the high side of the first resistor provides a reference signal to the second leg of the current mirror. The second leg of the current mirror includes a second resistor having a high side connected to the second terminal of the resistive shunt and a low side connected to a high side of a second device. A low side of the second device is connected to a high side of a third resistor and a low side of the third resistor is connected to the ground. The reference signal is received from the high side of the first resistor at an input of the second device, and the high side of the third resistor provides the ground referenced output signal. In some embodiments, the current sensing circuit also includes a bias resistor which induces a bias current in the second resistor such that the ground referenced output signal varies little in response to a change in an input voltage of the converter. The first and second devices can be any transistor type device such insulated gate field effect transistors (e.g., metal-oxide-semiconductor field effect transistors), bipolar junction transistors, and junction field effect transistors.

In one embodiment of the invention, a driver circuit for providing power from a power source to an LED includes the previously described current sensing circuit and a converter. The converter comprises a controller, a converter switch, an energy storage device, and a rectifier. The controller provides an input signal to the converter switch, causing the converter switch to conduct electricity which charges the energy storage device. When the controller discontinues the input signal, the converter switch ceases conducting electricity, and the energy storage device discharges into the rectifier. This operation is cyclical such that the rectifier provides DC power to the LED. The controller begins providing the input signal to the converter switch as a function of a voltage of a high side of the converter switch and discontinues providing the input signal as a function of the ground referenced output signal provided by the current sensing circuit. Thus, the controller controls switching of the converter switch as a function of a signal indicative of the current through the LED (i.e., the ground referenced output signal provided by the current sensing circuit), regulating the current provided to the LED by the converter.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Other features will be in part apparent and in part pointed out hereinafter.

BRIEF DESCRIPTION OF THE DRAWINGS

FIG. 3 is a flow chart of a method for supplying a regulated current to a load according to one embodiment of the invention.

Corresponding reference characters indicate corresponding parts throughout the drawings.

DETAILED DESCRIPTION

Figure 1:
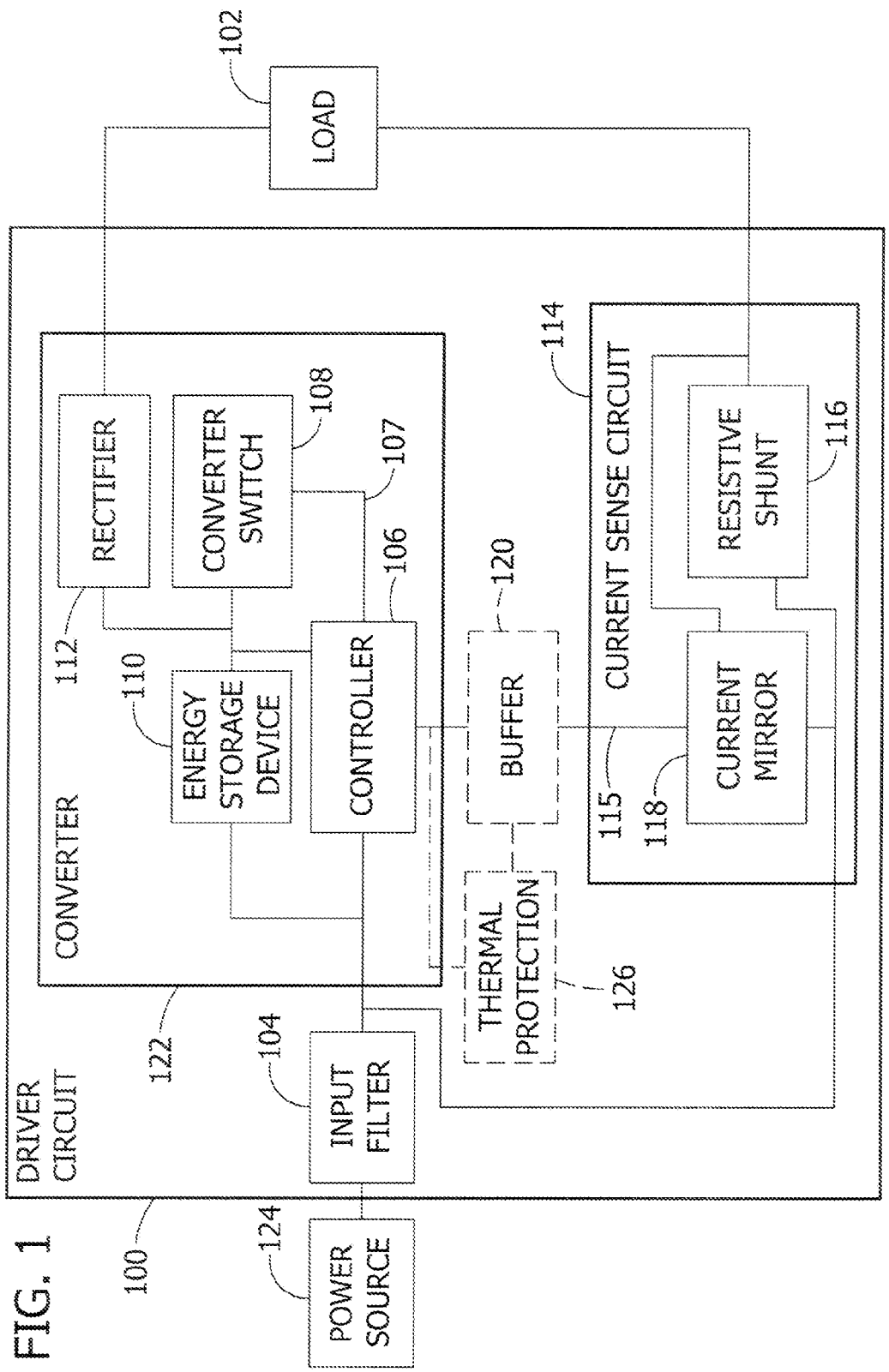
FIG. 1 is a block diagram of a driver circuit for providing a regulated current to a load according to one embodiment of the invention.

Referring to FIG. 1, a driver circuit 100 provides a regulated current to a load 102. An input filter 104 of the driver circuit 100 receives power from a power source 124, reduces noise in the received power, and provides a direct current (DC) input voltage to a power input of a converter 122 of the driver circuit 100. In one embodiment, the power source 124 is a DC power supply that varies in voltage from 8 to 16 volts (e.g., the electrical power system of a vehicle). A controller 106 of the converter 122 provides an input signal 107 to a converter switch 108 which causes the converter switch 108 to conduct electricity, charging an energy storage device 110. When the controller 106 discontinues the input signal 107 to the converter switch 108, the converter switch 108 ceases conducting electricity, and the energy storage device 110 discharges into a rectifier 112. The controller 106 cycles the input signal 107 to the converter switch 108 repeatedly such that the rectifier 112 switches and integrates the energy from the energy storage device 110 over time to provide DC power to the load 102.

A current sense circuit 114 of the driver circuit 100 provides to controller 106 a ground referenced output signal 115 indicative of a current provided to the load 102. The current sense circuit 114 includes a resistive shunt 116 in series with the load 102 and a current mirror 118 having a first leg and a second leg, each connected between a terminal of the resistive shunt 116 and a ground. Thus, load current passing through the load 102 passes through the resistive shunt 116 and creates a voltage difference across the resistive shunt 116 proportional to the load current. The current mirror 118 monitors the voltage difference across the resistive shunt 116 and provides the ground referenced output signal 115 to controller 106 as a function of the detected voltage difference.

The controller 106 receives the ground referenced output signal 115 and monitors a storage voltage at a connection between the converter switch 108 and the energy storage device 110. The storage voltage indicates to the controller 106 the amount of energy remaining in the energy storage device 110, and tends toward ground as the energy is discharged from the energy storage device 110. The controller 106 provides the input signal 107 to the converter switch 108 (which causes the converter switch 108 to conduct electricity) as a function of the storage voltage at the connection. That is, the controller 106 provides the input signal 107 when the storage voltage is decreasing at a predetermined rate. The controller 106 determines the length of time to supply the input signal 107 to the converter switch (i.e., determines when to discontinue the input signal 107) as a function of the ground referenced output signal 115 from the current sense circuit 114. Thus, the controller regulates the energy (i.e., current) provided to the load 102 by controlling the input signal 107 to the converter switch 108. In this embodiment, the input voltage supplied by the input filter 104 to the other components of the driver circuit 100 varies, and a frequency of the input signal 107 provided by the controller 106 will vary directly with the input voltage provided by the input filter 104 while the duty cycle of the input signal 107 is independently controlled as a function of the actual current provided to the load 102 (as determined by the current sense circuit 114).

Optionally, the driver circuit 100 may include a thermal protection circuit 126 and a buffer 120 (both shown in phantom). The thermal protection circuit 126 reduces the regulated current provided to the load 102 in order to prevent damage to the driver circuit 100 and load 102 due to overheating. The buffer 120 removes any noise from the ground referenced output signal 115 provided by the current sense circuit 114 and scales the ground referenced output signal 115 so that it is between 0 and 5 volts DC for a given maximum value of current in the load 102 and resistive shunt 116.

Figure 2A:
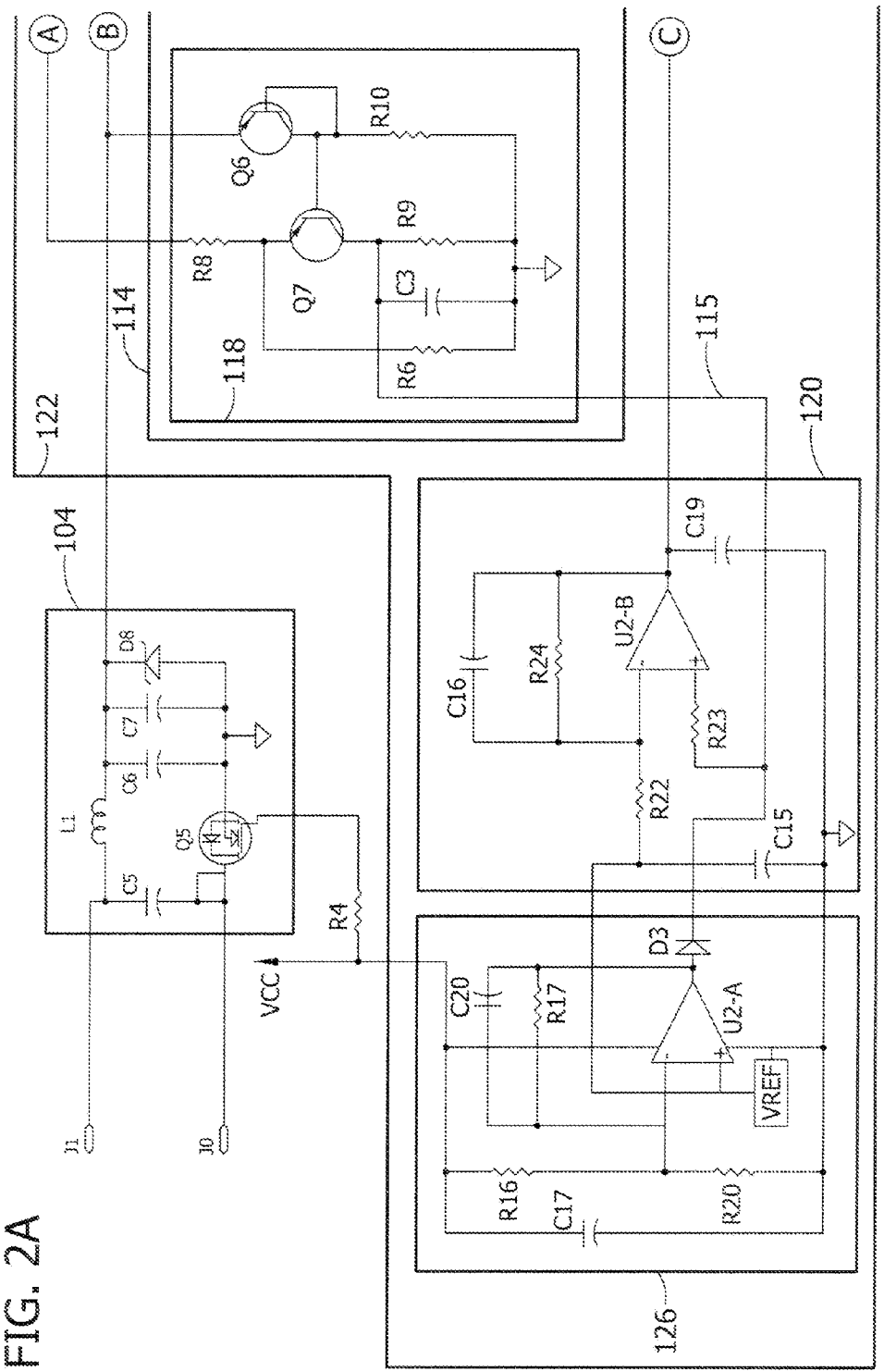
FIGS. 2A and 2B are a schematic diagram of one embodiment of the driver circuit of FIG. 1.
Figure 2B:
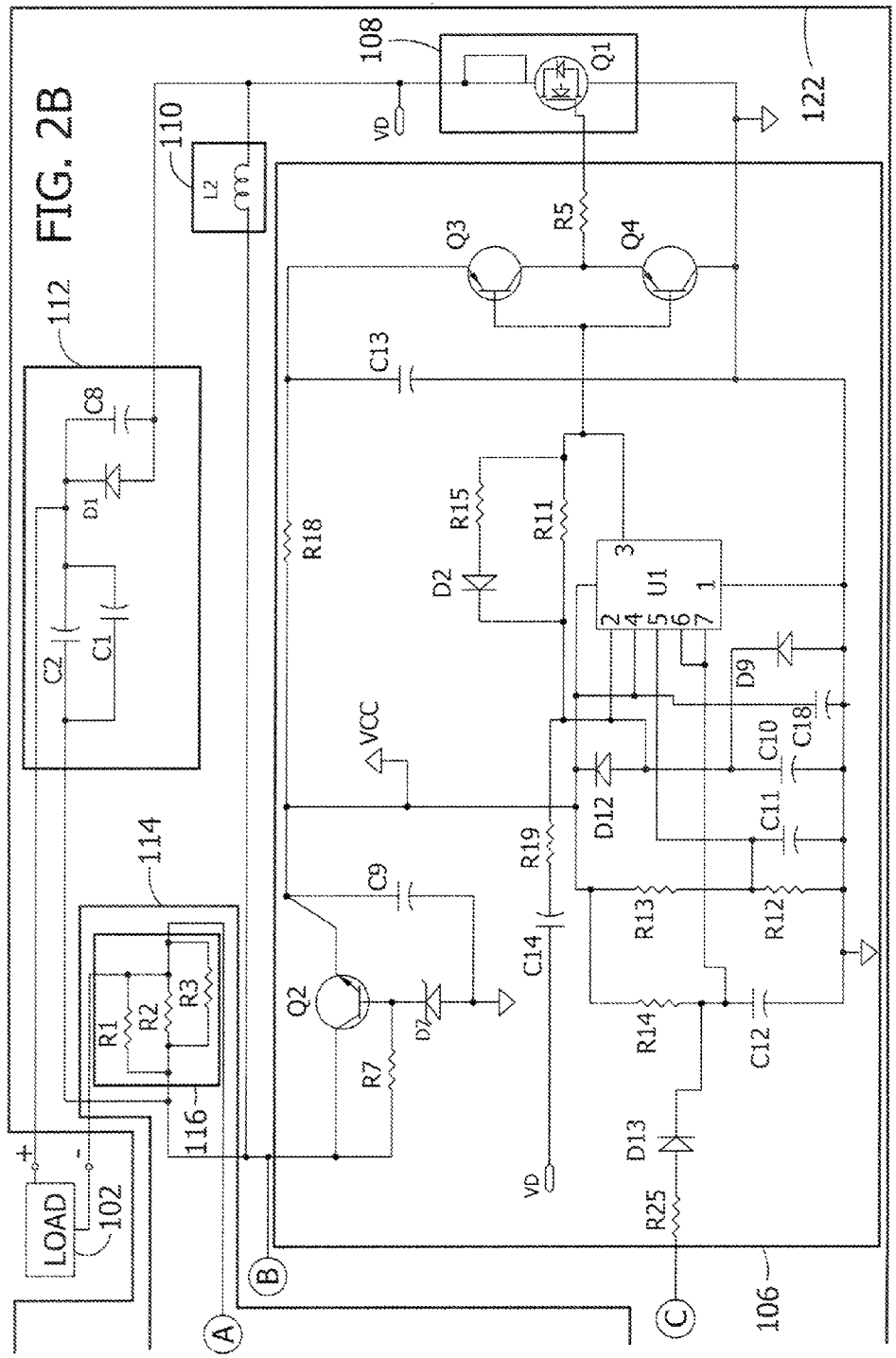

Referring to FIGS. 2A and 2B, a schematic diagram of one embodiment of a driver circuit implementing the block diagram of FIG. 1 is shown. A positive lead of the power source 124 connects to the input filter 104 of the driver circuit 100 at J1, and a negative lead (i.e., a ground) of the power source 124 connects to the driver circuit 100 at J0. Inductor L1 together with capacitors C5, C6, and C7 operate to block high frequency noise and provide other components of the driver circuit 100 with an input voltage. Zener diode D8 and switch Q5 protect the driver circuit 100 against over-voltage conditions and transient negative voltages respectively. The input filter 104 thus provides an input voltage to a power input of the converter 122, the energy storage device 110 (herein inductor L2), and the current sense circuit 114.

The converter switch 108 (herein converter switch Q1) selectively enables current to flow from the input filter 104 through an inductor L2 (i.e., the energy storage device 110) in response to the input signal 107 from the controller 106. A high side of the converter switch Q1 is connected to the inductor L2, a low side of the converter switch Q1 is connected to ground, and an input of the converter switch Q1 receives the input signal 107 from the controller 106. When converter switch Q1 discontinues conducting electricity in response to the controller 106 discontinuing the input signal 107, inductor L2 discharges into the rectifier 112.

An input of the rectifier 112 comprises a rectifier diode D1 and a capacitor C8 in parallel with the rectifier diode D1, and an output of the rectifier 112 comprises a capacitive network (i.e., capacitors C1 and C2 in parallel). The capacitor C8 allows high frequency energy to pass to the capacitive network, and the rectifier diode D1 allows lower frequency energy to pass to the capacitive network. Capacitors C1 and C2 connect between a positive terminal of rectifier 112 (i.e., a second terminal of the load 102) and a negative terminal of the rectifier 112 (i.e., the power input to the converter 122 from the input filter 104) and integrate the energy provided to the rectifier 112 by the inductor L2 (i.e., energy storage device 110) over time to provide a DC current to the load 102.

A first terminal of the resistive shunt 116 is connected to the power input of the converter 122 (i.e., the negative terminal of the rectifier 112), and a second terminal of the resistive shunt 116 is connected to a first terminal of the load 102. In the embodiment shown in FIG. 2B, the resistive shunt 116 comprises three resistors (R1, R2, and R3) in parallel. It is contemplated that the resistive shunt 116 can comprise any combination and configuration of resistors. It is also contemplated that the resistive shunt 116 may be connected between the second terminal of the load 102 and the positive terminal of rectifier 112.

The current mirror 118 comprises a first leg which connects between the first terminal of the resistive shunt 116 and ground and a second leg which connects between the second terminal of the resistive shunt 116 and ground. The first leg comprises a first resistor R10 and a first device Q6. The first device Q6 has a high side connected to the first terminal of the resistive shunt 116 and a low side connected to a high side of the first resistor R10. An input of the first device Q6 is connected to the low side of the first device Q6. A low side of the first resistor R10 is connected to ground. The high side of the first resistor R10 provides a reference signal to the second leg of the current mirror 118. The reference signal varies directly with the input voltage from the input filter 104 to the power input of the converter 122.

The second leg of the current mirror 118 comprises a second resistor R8, a second device Q7, and a third resistor R9. The second resistor R8 has a high side connected to the second terminal of the resistive shunt 116 and a low side connected to a high side of the second device Q7. The second device Q7 has an input connected to the high side of the first resistor R10 for receiving the reference signal and a low side connected to a high side of the third resistor R9. A low side of the third resistor R9 connects to ground. The current mirror 118 provides a ground referenced output signal 115 to the controller 106 from the high side of the third resistor R9. In one embodiment of the invention, the first device Q6 and the second device Q7 are a pair of unmatched but co-packaged PNP bipolar transistors. It is contemplated that a matched pair of transistors may be employed to increase accuracy of the current sense circuit 114, however, the incremental increase in accuracy is outweighed by the expense of matched transistors in many applications. It is also contemplated that the transistors may be separately packaged and may be of any transistor type including insulated gate field effect transistors and junction field effect transistors.

The current sense circuit 114 also includes a bias resistor R6 connected between the high side of the second device Q7 and ground. The bias resistor R6 allows some of the bias current through the second resistor R8 to flow directly to ground without passing through R9. This shunted bias current causes the current sensing circuit 114 to provide the ground referenced output signal 115 substantially independent of the input voltage to the converter 122. For example, the ground referenced output signal 115 varies less than 1.5% as the input voltage to the converter 122 varies from 8 volts DC to 16 volts DC for a given value of current in the resistive shunt 116 (e.g., 0.7 Amperes). In one embodiment, this is accomplished with a second resistor R8 having a resistance equal to about 1000 times the resistance of the resistive shunt 116, however, this resistance ratio may be between 30 and 3000 in other embodiments. In one embodiment, the second resistor R8, third resistor R9, and bias resistor R6 are selected such that a voltage developed across R8 varies directly as the voltage across the resistive shunt 116, and the output signal 115 is proportional to the current in the resistive shunt 116.

FIG. 2A includes an optional capacitor C3 in parallel with the third resistor R9 which reduces noise in the ground referenced output signal 115. FIG. 2A also includes the optional buffer 120 which further reduces transients in the ground referenced output signal 115 and scales the ground referenced output signal 115 to a 0 to 5 volt scale. Additionally, FIG. 2A shows the optional thermal protection circuit 126. A negative temperature coefficient thermistor R20 decreases in resistance as its temperature increases which affects the value of the output signal 115 provided to the buffer 120. In operation, this causes the controller 106 to detect an over-current condition and reduce the current provided to the load 102 when the driver circuit is exceeding a temperature threshold.

The controller 106 of the driver circuit 100 receives the input voltage from the input filter 104 (i.e., from the power input to the converter 122), a drain voltage from the high side of the converter switch Q1, and the ground referenced output signal 115 from the current sense circuit 114. A microcontroller, such as an integrated circuit timer U1, provides a pulse width modulated signal (i.e., the input signal 107) to switches Q3 and Q4 which constitute a push pull driver pair at the input of the converter switch Q1. Thus, the input signal 107 provided by the controller 106 to the converter switch Q1 causes the converter switch Q1 to have a relatively short transition time which reduces losses and increases the efficiency of the converter 122. In one embodiment, the timer U1 is an integrated circuit timer TS555 manufactured by ST Microelectronics.

When the converter switch Q1 stops conducting electricity and the inductor L2 (i.e., energy storage device 106) discharges, a voltage at the high side of the converter switch Q1 will collapse. This voltage change couples through a capacitor C14 and a resistor R19 to reduce the voltage at pin 2 of the timer U1 below its trigger threshold of about 0.7V. The controller 106 then provides the input signal 107 to the converter switch Q1, causing the converter switch Q1 to conduct electricity through the inductor L2 which recharges the inductor L2. The controller 106 provides the input signal 107 for a length of time determined as a function of the ground referenced output signal 115 received at resistor R25 of the controller 106. The controller 106 then monitors the drain voltage at the high side of the converter switch Q1 to determine when to begin the next cycle (i.e., when to reapply the input signal 107 to the converter switch Q1). Thus, the controller provides the converter switch Q1 with a pulse width modulated (PWM) signal that is a function of the drain voltage of the converter switch Q1 and a measured actual current through the load 102 such that the current through the load 102 is regulated at a fixed amount. As a result of this operation, the frequency of the PWM input signal varies directly as a function of the input voltage to the power input of the converter 122, and the duty cycle is adjusted to regulate the current provided to the load.

In one embodiment of the invention, the load 102 comprises a series of 5 white light emitting diodes, and the regulated current provided to the load 102 is 0.7 Amperes. The input signal 107 from the controller 106 to the converter switch Q1 operates at a nominal 350 kilo Hertz (which varies as a function of the input voltage at the power input of the converter 122), and the input voltage provided to the converter 122 varies from 8 to 16 volts DC.

Referring to FIG. 3, a method of providing a regulated current to a load from a converter is shown according to one embodiment of the invention. The method begins at 300 and at 302 a resistive shunt in series with the load provides a voltage difference for a current mirror. At 304, a first leg of the current mirror connected between a first terminal of the resistive shunt and a ground provides a reference signal. At 306, a second leg of the current mirror connected between a second terminal of the resistive shunt and the ground receives the reference signal and provides a ground referenced output signal 115 as a function of a voltage at the second terminal of the resistive shunt and the reference signal (i.e., as a function of the voltage difference provided by the resistive shunt). At 308, a controller receives the ground referenced output signal 115 and a high side voltage of a high side of a converter switch and provides an input signal 107 to the converter switch as a function of the high side voltage and the ground referenced output signal 115 which provides a controlled amount of energy to the load. The method ends at 310, however the method is cyclical (i.e., continuously repeated) such that the load is continuously provided a controlled amount of energy (i.e., the load is provided with a regulated current).

The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Embodiments of the invention may be implemented with computer-executable instructions. The computer-executable instructions may be organized into one or more computer-executable components or modules. Aspects of the invention may be implemented with any number and organization of such components or modules. For example, aspects of the invention are not limited to the specific computer-executable instructions or the specific components or modules illustrated in the figures and described herein. Other embodiments of the invention may include different computer-executable instructions or components having more or less functionality than illustrated and described herein.

When introducing elements of aspects of the invention or the embodiments thereof, the articles "a," "an," "the," and "said" are intended to mean that there are one or more of the elements. The terms "comprising," "including," and "having" are intended to be inclusive and mean that there may be additional elements other than the listed elements.

Having described aspects of the invention in detail, it will be apparent that modifications and variations are possible without departing from the scope of aspects of the invention as defined in the appended claims. As various changes could be made in the above constructions, products, and methods without departing from the scope of aspects of the invention, it is intended that all matter contained in the above description and shown in the accompanying drawings shall be interpreted as illustrative and not in a limiting sense.

What is claimed is:

1. A current sensing circuit to be used with a load energized by a converter, the current sensing circuit comprising:
   a resistive shunt having a first terminal connected to a first terminal of the converter and a second terminal connected to a first terminal of the load;
   a current mirror to detect a voltage difference between the first and second terminals of the resistive shunt, the current mirror comprising:
      a first leg connected between the first terminal of the resistive shunt and a ground providing a reference signal indicative of the voltage of the converter relative to the ground; and
      a second leg connected between the second terminal of the resistive shunt and the ground providing a ground referenced output signal as a function of the reference signal and the voltage of the second terminal of the resistive shunt, whereby the ground referenced output signal is indicative of a current provided to the load from the converter.

2. The current sensing circuit of claim 1 wherein:
   the first terminal of the resistive shunt is connected to a power input of the converter;
   the converter provides the load with a regulated current;
   the load comprises a plurality of light emitting diodes; and
   a second terminal of the converter is connected to a second terminal of the load.

3. The current sensing circuit of claim 1 wherein:
   the first terminal of the resistive shunt is connected to a power input of the converter;
   the converter provides the load with a regulated current;
   the load comprises a plurality of solid state lighting sources; and
   a second terminal of the converter is connected to a second terminal of the load.

4. The current sensing circuit of claim 1 wherein the first leg comprises:
   a first device receiving the voltage of the converter, the first device having a high side, a low side, and an input wherein the input is connected to the low side and the high side is connected to the first terminal of the resistive shunt, the high side receiving the voltage of the converter; and
   a first resistor providing the reference signal, the resistor having a low side connected to the ground and a high side connected to the low side of the first device, the high side of the first resistor providing the reference signal.

5. The current sensing circuit of claim 1 wherein the second leg comprises:
   a second resistor receiving the voltage of the second terminal of the resistive shunt, the second resistor having a high side and a low side, wherein the high side is connected to the second terminal of the resistive shunt and receives the voltage of the second terminal of the resistive shunt;
   a second device receiving the reference signal, the second device having a high side, a low side, and an input, the input receiving the reference signal, wherein the high side is connected to the low side of the second resistor;
   a third resistor providing the ground referenced output signal, the third resistor having a high side connected to the low side of the second device and a low side connected to the ground wherein the high side provides the ground referenced output signal; and
   a voltage compensation circuit connected between the high side of the second device and the ground compensating for a nonlinear voltage response of the second device such that the ground referenced output signal has a relatively low variation as a function of a voltage of the first terminal of the resistive shunt.

6. The current sensing circuit of claim 5 wherein the voltage compensation circuit comprises a bias resistor and the relatively low variation of the ground referenced output signal is less than 1.5%, and wherein the first device and the second device each comprise a transistor.

7. The current sensing circuit of claim 5 wherein the first, second, and third resistors are selected to scale the ground referenced output signal such that the ground referenced output signal is between 0 and 5 volts for any value of the voltage difference across the resistive shunt.

8. The current sensing circuit of claim 2 wherein a voltage of the power input of the converter fluctuates between 8 and 16 volts direct current and the plurality of light emitting diodes comprises five light emitting diodes connected in series with one another.

9. The current sensing circuit of claim 3 wherein a voltage of the power input of the converter fluctuates between 8 and 16 volts direct current and the plurality of solid state lighting sources comprises five solid state lighting sources connected in series with one another.

10. A driver circuit to provide power from a power source to a solid state lighting source, the driver circuit comprising:
    a current sensing circuit providing a ground referenced output signal indicative of a current to the solid state lighting source, the current sensing circuit comprising:
       a resistive shunt in series with the solid state lighting source, the resistive shunt having a first terminal connected to the driver circuit and a second terminal connected to the solid state lighting source;
       a current mirror to detect a voltage difference between the first and second terminals of the resistive shunt and providing the output signal as a function of the voltage difference, the current mirror comprising:
          a first leg connected between the first terminal of the resistive shunt and a ground to receive a voltage of the driver circuit and to provide a reference signal indicative of the voltage of the driver circuit relative to the ground; and
          a second leg connected between the second terminal of the resistive shunt and the ground to receive the provided reference signal and a voltage of the second terminal of the resistive shunt and to provide the ground referenced output signal as a function of the reference signal and the voltage of the second terminal of the resistive shunt; and the driver circuit further comprising a converter receiving the ground referenced output signal from the current sensing circuit and the power from the power source, and providing power to the solid state lighting source from the power source as a function of the received ground referenced output signal.

11. The driver circuit of claim 10 wherein the converter comprises:

a controller receiving the ground referenced output signal from the current sensing circuit;

a converter switch selectively conducting electricity in response to receiving an input signal from the controller;

an energy storage device storing energy when the converter switch is conducting electricity and providing energy when the converter switch is not conducting electricity; and a rectifier receiving the energy provided by the energy storage device and integrating the energy over time to provide direct current power to the solid state lighting source;

wherein the converter switch has a high side connected to the energy storage device and a low side connected to ground; and wherein the controller provides the input signal to the converter switch as a function of a voltage of the high side of the converter switch and discontinues providing the input signal to the converter switch as a function of the received ground referenced output signal from the current sensing circuit.

12. The driver circuit of claim 10 wherein a second terminal of the converter is connected to a second terminal of the solid state lighting source and wherein in the current sensing circuit:

the first terminal of the resistive shunt is connected to a power input of the converter; and the load comprises a plurality of solid state lighting sources.

13. The driver circuit of claim 10 wherein the first leg of the current mirror of the current sensing circuit comprises:

a first device receiving the voltage of the converter, the first device having a high side, a low side, and an input wherein the input is connected to the low side and the high side is connected to the first terminal of the resistive shunt, the high side receiving the voltage of the converter; and a first resistor providing the reference signal, the resistor having a low side connected to the ground and a high side connected to the low side of the first device, the high side of the first resistor providing the reference signal.

14. The driver circuit of claim 10 wherein the second leg of the current mirror of the current sensing circuit comprises:

a second resistor receiving the voltage of the second terminal of the resistive shunt, the second resistor having a high side and a low side, wherein the high side is connected to the second terminal of the resistive shunt and receives the voltage of the second terminal of the resistive shunt;

a second device receiving the reference signal, the second device having a high side, a low side, and an input, the input receiving the reference signal, wherein the high side is connected to the low side of the second resistor;

a third resistor providing the ground referenced output signal, the third resistor having a high side connected to the low side of the second device and a low side connected to the ground wherein the high side provides the ground referenced output signal; and a voltage compensation circuit connected between the high side of the second device and the ground compensating for a nonlinear voltage response of the second device such that the ground referenced output signal is substantially independent of a voltage of the first terminal of the resistive shunt.

15. The driver circuit of claim 14 wherein the voltage compensation circuit comprises a bias resistor and the ground referenced output signal varies less than 1.5%, and wherein the first device and the second device each comprise a transistor.

16. The driver circuit of claim 14 wherein the first, second, and third resistors of the current sensing circuit are selected to scale the ground referenced output signal such that the ground referenced output signal is between 0 and 5 volts for any value of the voltage difference across the resistive shunt.

17. The driver circuit of claim 12 wherein a voltage of the power input of the converter fluctuates between 8 and 16 volts direct current and the plurality of solid state lighting sources comprises five solid state lighting sources connected in series with one another.

* * * * *